United States Patent [19]

Carlick et al.

[11] 3,840,369

[45] Oct. 8, 1974

[54] PRESENSITIZED PRINTING PLATES

[75] Inventors: Daniel J. Carlick, Northbrook, Ill.; Frank Marra, Wayne, N.J.; Gerhard E. Sprenger, North Stonington, Conn.

[73] Assignee: Sun Chemical Corporation, New York, N.Y.

[22] Filed: Nov. 10, 1971

[21] Appl. No.: 197,510

Related U.S. Application Data

[63] Continuation-in-part of Ser. No. 850,633, Aug. 15, 1969, abandoned.

[52] U.S. Cl. .......... 96/33, 96/35.1, 96/67, 96/86 P, 96/87 R, 96/115 P, 101/456, 101/457, 101/462, 101/467, 204/159.15, 204/159.23

[51] Int. Cl. .......... G03f 7/02

[58] Field of Search .......... 96/115 P, 33; 204/159.15, 204/159.22, 159.23; 101/456, 457, 454, 462, 463, 465, 467

[56] References Cited

UNITED STATES PATENTS

| | | | |
|---|---|---|---|
| 3,262,780 | 7/1966 | Thommes | 96/115 P |
| 3,297,745 | 1/1967 | Fekete et al. | 240/471 C |
| 3,368,900 | 2/1968 | Burg | 96/115 P |
| 3,425,988 | 2/1969 | Gorman et al. | 161/190 |
| 3,462,268 | 8/1969 | Danhauser et al. | 96/115 P |
| 3,509,234 | 4/1970 | Burlant et al. | 204/159.15 |
| 3,515,657 | 6/1970 | Nakanome et al. | 204/159.23 |
| 3,551,246 | 12/1970 | Bassemir et al. | 117/132 BE |
| 3,551,311 | 12/1970 | Nass et al. | 117/124 E |

*Primary Examiner*—Ronald H. Smith
*Assistant Examiner*—Edward C. Kimlin
*Attorney, Agent, or Firm*—Cynthia Berlow

[57] ABSTRACT

Presensitized printing plates are prepared by a process which comprises the steps of (1) coating a support with a radiation-curable composition, (2) placing a negative of the image to be printed on the coated support, (3) exposing the thus-formed system to radiation to effect polymerization of the exposed portion of the coating on the support and leaving the unexposed portion wet and uncured, (4) removing the negative, and (5) removing the uncured areas to produce an oleophilic image area and a hydrophilic non-image background. The radiation-curable composition comprises at least one isocyanate-modified polyethylenically unsaturated ester and at least one photoinitiator with optionally at least one polyethylenically unsaturated ester having free hydroxyl groups.

11 Claims, No Drawings

PRESENSITIZED PRINTING PLATES

This application is a continuation-in-part of copending application Ser. No. 850,633 (filed 8/15/69), now abandoned.

This invention relates to presensitized printing plates and to a process for producing images suitable for use as printing plates. More particularly it relates to printing plates made from a radiation-curable composition.

Image formation by photopolymerization was described in the early 1940's. According to British Patent No. 566,795, for example, Gates formed shallow relief images in methyl methacrylate, using a combination of radiation and heat. A wide variety of types of such plastic lithographic plates now exist which in general are durable and relatively inexpensive with rapid, simple processing and good printing quality. Plastic printing plates have uniform ink acceptance and ink transfer and can be produced to tight tolerances. Plastic also have wear-resistance and light weight.

Even such plastic systems, however, have numerous and serious disadvantages, important among which are (1) the need to prepare and use many of the plates in the absence of oxygen, (2) the need to use dangerous and toxic solvents or solutions in preparing the plates, and (3) the relatively long time required to make the plate, that is, to cure the coating composition and to remove the uncured portion.

The use of radiation-curable ethylenically unsaturated monomeric materials, for example as disclosed in U.S. Pat. Nos. 3,551,235; 3,551,246; 3,551,311; and 3,558,387, has been successful in overcoming these disadvantages; however, the use of these materials is somewhat limited by their strong affinity for water. The reason for this water-sensitivity is not now fully understood, but it is believed to be due, at least in part, to the presence of hydroxyl groups.

It has been found that the hydrophilic nature of these compositions can be somewhat lessened by modifying the monomeric material of the composition with an isocyanate. As used hereinafter, unless otherwise specified "monomeric material" means both monomers and prepolymers, that is dimers, trimers, and other oligomers and mixtures and copolymers thereof. The resulting isocyanate-modified material has decreased water-sensitivity without loss in radiation-susceptibility or adverse effect on its other properties, e.g., smoothness, adhesion, gloss, and so forth.

In general the radiation-curable compositions used to prepare the printing plates of this invention comprise (a) at least one isocyanate-modified ester of a polyhydric alcohol with an ethylenically unsaturated acid and (b) at least one photoinitiator with optionally at least one polyethylenically unsaturated ester having free hydroxyl groups which may be the same as *a* or different.

The compositions used herein are free of volatile solvents and dry almost instantaneously in air upon exposure to radiation at ambient temperature, thus eliminating the need to work in an oxygen-free environment. The cured compositions are oleophilic and resistant to flaking, abrasion, scuffing, rubbing, solvents, and the like. The uncured composition is readily removed from a support by washing with, for example, esters, ketones, alcohol-hydrocarbon combinations, and the like.

The printing plates of this invention are conveniently prepared by the following steps: (1) exposing imagewise to a source of radiation an element consisting of a support having thereon a radiation-curable composition consisting of (a) at least one isocyanate-modified ester of an ethylenically unsaturated acid and a polyhydric alcohol and (b) at least one photoinitiator whereby in the exposed areas the radiation-curable composition is cured to an insoluble state; (2) removing the composition from the uncured non-exposed areas to produce a non-tacky, inert, oleophilic image area and a hydrophilic non-image background; and (3) gumming the plate non-image areas to protect the hydrophilicity of these areas.

The support is any suitable rigid material to which a film of the radiation-curable composition will adhere, such as for example smooth or grained metal sheets, foils, or meshes, e.g., aluminum, copper, steel, bronze, chrominum, zinc, or magnesium; paper, including bond paper, resin- and clay-sized paper, resin-coated or resin-impregnated paper, and cardboard; wood; glass; rubber; plastics, such as nylon, polyethylene, polypropylene polyesters; regenerated cellulose; cellulose esters, e.g., cellulose acetate, silk, wool, rayon; or the like. In general the thickness of the support ranges from about 0.002 to about 0.025 inch.

The radiation-curable compounds usable in the present invention are isocyanate-modified polyfunctional ethylenically unsaturated monomers and prepolymers and mixtures and copolymers thereof. The term "polyethylenically unsaturated" as employed herein refers to compounds having two or more terminal or pendant ethylenic groups. The starting monomers or prepolymers may be generally described as the acrylic acid, methacrylic acid, itaconic acid, and the like, esters of aliphatic polyhydric alcohols such as, for example, the di- and polyacrylates, the di- and polymethacrylates, and the di- and polyitaconates of ethylene glycol, triethylene glycol, tetraethylene glycol, tetramethylene glycol, trimethylolethane, trimethylolpropane, pentaerythritol, dipentaerythritol, tripentaerythritol, other polypentaerythritols, and the like, mixtures with each other or with their partially esterified analogs, and their prepolymers, said compound or mixture having free hydroxyl content. Typical compounds include, but are not limited to, trimethylolpropane triacrylate, trimethylolethane triacrylate, trimethylolpropane trimethacrylate, trimethylolethane trimethacrylate, tetramethylene glycol dimethacrylate, ethylene glycol dimethacrylate, triethylene glycol dimethacrylate, tetraethylene glycol diacrylate, tetraethylene glycol dimethacrylate, pentaerythritol diacrylate, pentaerythritol triacrylate, pentaerythritol tetraacrylate, dipentaerythritol diacrylate, dipentaerythritol triacrylate, dipentaerythritol tetraacrylate, dipentaerythritol pentaacrylate, dipentaerythritol hexacrylate, tripentaerythritol octoacrylate, pentaerythritol dimethacrylate, pentaerythritol trimethacrylate, dipentaerythritol dimethacrylate, dipentaerythritol tetramethacrylate, tripentaerythritol octamethacrylate, pentaerythritol diitaconate, dipentaerythritol trisitaconate, dipentaerythritol pentaitaconate, dipentaerythritol hexaitaconate, and the like, and the mixtures and prepolymers thereof, mixtures of dimers and trimers of tripentaerythritol octoacrylate, mixtures of dimers and trimers of dipentaerythritol hexacrylate, and the like;

and mixtures of these with their partially esterified analogs wherein some hydroxyl content must exist.

The above-described esters may be obtained in any convenient manner, for example, by the ester interchange method of interacting a lower alkyl ester of the acid with the alcohol in the presence of a suitable catalyst or by the reaction of the alcohol with, for example, acrylic or methacrylic acid or with an acrylyl or a methacrylyl halide.

The monomer, prepolymer, or mixture thereof is reacted with an isocyanate to yield a material that has increased hydrophobic properties and thus improved water-resistance, smoothness, gloss, and so forth, as well as increased curing speed. The isocyanate-modified ester is conveniently prepared by reacting the monomeric material with the isocyanate. Although in general it has been found that the temperature is not critical, the reaction is usually carried out within the range of about 25° to 100°C., and preferably at about 50°C.

While it is possible to convert all of the hydroxyl groups of the starting ester to carbamate groups, it is desirable not to convert all of the hydroxyl groups, that is, to leave in the composition some ester having free hydroxyl content, since the use of excessive amounts of isocyanate in the reaction results in products having decreased storage stability. The amount of isocyanate that must be reacted with the ester to obtain a product with optimum properties will vary with the specific monomeric material and the type of isocyanate employed and with the properties that are desired. For example, for use in lithography, in a compound prepared from phenyl isocyanate the conversion is preferably not in excess of about 60 per cent of the hydroxyl content.

In addition, the ration of —NCO groups to —OH groups is important; this also varies with the specific monomer and isocyanate selected. When, for example, the ester is a pentaerythritol-3.5-acrylate, that is, a mixture of approximately 50 percent of the triacrylate and 50 percent of the tetraacrylate, the ratio of —NCO groups to —OH groups is generally within the range of about 0.2 to 0.8, and preferably the ratio is about 0.6.

Any of a wide variety of suitable organic isocyanates may be employed, including aliphatic, cycloaliphatic, heterocyclic, and aromatic mono- and polyisocyanates, and combinations of these. Examples include, but are not limited to 6-ethyldecyl isocyanate, octadecyl isocyanate, phenyl isocyanate, chlorophenyl isocyanate, stearyl isocyanate, cyclohexyl isocyanate, 6-phenyldecyl isocyanate, 6-cyclohexyldodecyl isocyanate, tolylene-2, 4-diisocyanate, tolylene-2, 6-diisocyanate, phenylene-1, 4-diisocyanate, hexamethylene diisocyanate, naphthalene-1, 4-diisocyanate, naphthalene-1, 5-diisocyanate, diphenylmethane-4, 4$^1$-diisocyanate, butylene-1, 4-diisocyanate, ethylene diisocyanate, trimethylene diisocyanate, tetramethylene-1, 4-diisocyanate, butylene-2, 3-diisocyanate, cyclohexylene-1,2-diisocyanate, methylene-bis (4-phenylisocyanate), diphenyl-3,3$^1$-dimethyl-4,4$^1$-diisocyanate, xylylene diisocyanate, cyclohexane-1,4-diisocyante, 1-methoxyphenyl-2,4-diisocyanate, benzene-1,2,4-triisocyanate, polymethylene polyphenylisocyanate, toluene-2,4,6-triisocyanate, 4,4$^1$-dimethyldiphenyl methane-2,2$^1$,5,5$^1$-tetraisocyanate, and the like, and mixtures thereof.

The isocyanate reacts with the ethylenically unsaturated hydroxyl material to give the carbamate reaction product, thus reducing the free hydroxyl content of the starting compound and so reducing its water sensitivity. This increase in the hydrophobicity has made the products more suitable for use in printing pates, coating compositions, etc., without loss in stability and with increased speed of curing.

The photoinitiator may be an acyloin; an acyloin derivative; or a halogenated aliphatic, aromatic, or alicyclic hydrocarbon, or a mixture thereof, in which at least one of the halogen atoms is attached directly to the ring structure in the aromatic and alicyclic compounds, that is, the halogen is bonded directly to the hydrocarbon nucleus, and to the carbon chain in the aliphatic compounds, the halogen being chlorine, bromine, iodine, or fluorine. Suitable photoinitiators include, for example, benzoin, benzoin methyl ether; benzoin ethyl ether; didesyl ether; desyl bromide; desyl chloride; desyl amine; polychlorinated polyphenyl resis, such as the Aroclors (Monsanto Chemical Co.) which in general are polychlorinated diphenyls, polychlorinated triphenyls, and mixtures of the two; chlorinated rubbers, such as the Parlons (Hercules Powder Co.); copolymers of vinyl chloride and vinyl isobutyl ether, such as Vinoflex MP-40C (BASF Colors and Chemicals Inc.); chlorinated aliphatic waxes, such as Chlorowax 70 (Diamond Alkali Co.); perchloropentacyclodecane, such as Dechlorane+ (Hooker Chemical Co.); chlorinated paraffins, such as Chlorafin 40 (Hooker Chemical Co.) and Unichlor-70B (Neville Chemical Co.); mono-and polychlorobenzenes; mono- and polybromoxylenes; dichloromaleic anhydride; halogenated polyolefins, such as chlorinated polyethylene; 2,4-dimethylbenzene sulfonyl chloride; 1-bromo-3-(m-phenoxyphenoxy benzene); 2-bromoethylmethyl ether; chlorendic anhydride; and so forth; and mixtures of these.

The radiation-curable composition may also include, if desired, about 0.1 to 2.0 percent, based on the weight of the total composition, of an accelerating agent, such as the mercaptans and their derivatives, for example, ethyl mercaptoacetate; amine oxides, such as bis (2-hydroxyethyl) cocoamine oxide and bis (2-hydroxyethyl) octadecylamine oxide; cyclized unsaturated aromatic hydrocarbons, e.g., neohexene, cyclohexene, cyclooctene, and d-limonene; and the like; and mixtures thereof. The above described additives may further be used in varying mixtures. The radiation-curable esters may be modified, if desired, by the addition of a prepolymer, such as a diallyl phthalate prepolymer, and a chain transfer agent; a prepolymer and an unsaturated compound reactive with oxygen, e.g., an alkyd resin; a prepolymer and a further modifying substance, e.g., cetyl vinyl ether; a viscosity control agent together with a chain transfer agent, a prepolymer, or other modifying resis; and mixtures thereof.

The ratio of the amount of the isocyanate-modified monomeric material to the photoinitiator in the composition may range from about 99:1 to about 15:85, and preferably from about 70:30 to about 30:70.

Other commonly known modifiers may be incorporated into the formulations using the compositions, including plasticizers; leveling agents, such as lanolin, paraffin waxes, and natural waxes; and the like. Such modifiers are generally used in amounts ranging up to about 3 percent by weight, preferably about 1 percent, based on the total weight of the formulation.

The formulations may be prepared in any convenient manner, such as, for example, in a three-roll mill, a sand mill, a ball mill, a colloid mill, or the like, in accordance with known dispersion techniques.

The resulting composition may be applied to the support in any suitable manner, e.g., by solvent casting, roller coating, printing or blade coating, in a layer about 0.1 to 5.0, and preferably about 0.2 to 2.0, mils thick.

Imaging may be accomplished in any suitable way, such as through a process negative, a stencil, a drawing, a projected design, or the like in near or direct contact with the surface of the radiation-curable layer; by reflectographic or projection exposure; by electrical discharge techniques, or the like.

The thus-formed system is then subjected imagewise to a source of actinic radiation to cure the exposed portions of the coating composition.

Variables which determine the rate at which a radiation-curable composition will dry include the nature of the support, the specific ingredients in the composition, the concentration of the photoinitiator, the thickness of the material, the nature and intensity of the radiation source and its distance from the material, the presence or absence of oxygen, and the temperature of the surrounding atmosphere. Irradiation of the compositions may be accomplished by any one or a combination of a variety of methods. The composition may be exposed, for example, to actinic light from any source and of any type as long as it furnishes an effective amount of ultraviolet radiation, since the compositions of this invention activatable by actinic light generally exhibit their maximum sensitivity in the range of about 3000 A. to 4000 A., and preferably about 2000 A. to 3500 A.; electron beams; gamma radiation emitters; and the like; and combinations of these. Suitable sources include, but are not limited to, carbon arcs, mercury-vapor arcs, Van der Graaff accelerators, Resonant transformers, Betatrons, linear accelerators, and so forth.

The time of irradiation must be sufficient to give the effective dosage. Irradiation may be carried out at any convenient temperature, and most suitably is carried out at room temperature for practical reasons. Distances of the radiation source from the work may range from about ⅛ to 10 inches, and preferably from about ⅛ to 3 inches.

The imaging means is then removed and the unexposed portions of the coating composition are washed away using a suitable solvent with, for example, a manual or motorized brush or sponge. Suitable solvents include methylethyl ketone, ethyl acetate, acetone, and the like. The plate is then gummed with a suitable solution, such as for example gum arabic or cellulose gum.

The resulting planographic-type printing plate, that is one which substantially does not contain raised or depressed image areas, may then be placed in a lithographic press and inked. Since the printing ink is oleophilic in nature, it adheres to and is transferred from the oleophilic image areas and is repelled from the hydrophilic non-image background areas.

While this invention has been illustrated by a process for preparing planographic printing plates, it is not intended to be limited thereto. The process of this invention is applicable also to the preparation of relief plates by using a thicker layer of the radiation-curable composition.

The printing plates of this invention are extremely durable, easily made up, and have excellent lithographic properties. They are prepared and used under normal ambient conditions. The compositions used to form the image are radiation-curable and cure almost instantaneously even in the presence of air or oxygen at room temperature. The compositions are essentially non-volatile. The cured composition is retained on the surface of the support by a very firm and secure physical bond therewith. It has excellent flexibility, chemical resistance, abrasion resistance, and resolution.

The invention is further illustrated by, but not intended to be limited to, the following detailed examples. Unless otherwise indicated, all parts are given by weight.

Example 1

A. In a 5-liter three-necked flask connected with a stirrer, a thermometer, and a condenser were placed 1420 ml. of dried benzene, 409 grams (3moles) of pentaerythritol, 3 grams of cuprous oxide (as polymerization inhibitor), 46 grams of concentrated sulfuric acid (as catalyst), and 1296 grams (18 moles) of glacial acrylic acid with 1 percent of p-methoxyphenol (as inhibitor).

The mixture was heated at about 88°C. until 62.3 grams (3.46 moles) of water of esterification per mole of pentaerythritol was removed.

After cooling, the mixture was washed with 700 ml. of 20 percent NaCl solution, twice with 350 ml. of 24 percent $KHCO_3$ solution and finally with 350 ml. of 20 percent NaCl solution. The benzene solution was filtered, 0.8 gram of p-methoxyphenol added, and the remaining solvent removed in vacuum using copper wire as an inhibitor.

The yield was 316 grams per mole of the pentaerythritol employed of a pale yellow liquid which, upon standing, solidified to a semi-solid, melting at 48–49°C. and having a viscosity of 875 Cps. Analysis showed 1.5 percent volatiles and an equivalent weight of 95.0 based on the saponification value.

The product was accordingly assigned the empirical formula $(HOH_2C)_{0.54}—C—(CH_2OOC—CH{:}CH_2)_{3.46}$ indicating that it was a mixture of pentaerythritol triacrylate and pentaerythritol tetraacrylate in the ratio of 0.54:0.46 mole, having a hydroxyl equivalent of 607.

B. 607 Grams of the product of part A was placed in a dry three-necked flask equipped with an agitator, a thermometer, a dropping funnel, and a gas inlet and outlet tube. At room temperature while agitating the charge and passing a small stream of dry air through the flask above the surface of the liquid, 72.6 grams (0.61 mole) of phenyl isocyanate was added slowly through the dropping funnel. After completion of the addition (about 1 hour), the reaction mass was allowed to stand for three hours and then discharged.

The product was a viscous, slightly yellow liquid having a viscosity of 2680 Cps. as measured with a Brookfield Viscosimeter (No. 4 spindle at 60 rpm). Infrared analysis indicated the absence of the isocyanate peak and hence complete reaction. The product was a mixture of unmodified pentaerythritol triacrylate, unmodified pentaerythritol tetraacrylate, and pentaerythritol triacrylate-monophenyl carbamate.

C. A composition consisting of 70 parts of the product of part B and 30 parts of Aroclor 4465 (Monsanto Chemical Co.'s mixture of biphenyl and triphenyl containing about 65 weight percent of chlorine) was coated onto a 0.007-inch thick sheet of aluminum to give a dry coating thickness of about 0.3 mil. The element, i.e., the support plus the coating composition, was exposed for 30 seconds through a lithographic negative at a distance of 3 inches from a 550-watt Hanovia mercury arc lamp. The negative was then removed, and the unexposed composition was washed off with ethyl acetate. The plate was then treated with gum arabic, washed with water, and inked with a conventional lithographic ink which was picked up by the image areas and rejected by the non-image areas.

Example 2

The procedure of Example 1 (C) was repeated except that the ratio of the product of Example 1 (B) to the Aroclor was each of the following instead of 70/30 : 25/75, 50/50, 60/40, and 80/20. The results were comparable.

Example 3

A. 607 Parts of pentaerythritol-3.46-acrylate, prepared by the process of part A of Example 1 and having a refractive index of $n_D^{25} = 1.4850$, was charged into a dry three-necked flash equipped with an agitator, a thermometer, a dropping funnel, and gas inlet and outlet tube. While agitating at room temperature and passing a small stream of dry air through the flask above the surface of the liquid, 26 parts of tolylene-2,4-diisocyanate (0.15 mole) was slowly over a period of 30 minutes introduced through the dropping funnel. After the completion of the addition, the reaction mass was allowed to stand for several hours and then discharged.

The product was a viscous, slightly yellow liquid having a viscosity of 2460 Cps. as measured at 25°C. with a Brookfield Viscosimeter (No. 4 spindle at 60 rpm.). Infrared analysis indicated the absence of the isocyanate peak and hence complete reaction after 20-hours reaction time. The material was a physical mixture of unchanged pentaerythritol triacrylate, unreacted pentaerythritol tetraacrylate, and the reaction product of pentaerythritol triacrylate with tolylene-2,4 diisocyanate, that is, the compound of the formula

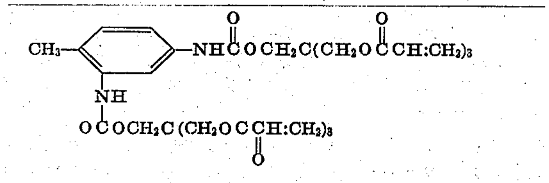

B. The procedure of part C of Example 1 was repeated using a 70/30 mixture of the product of part A and Aroclor 4465. The results were comparable.

Example 4

The procedures of parts A and B of Example 3 were repeated using as the isocyanate an 80:20 mixture of tolylene-2,4-diisocyanate and tolylene-2,6-diisocyanate instead of pure tolylene-2,4-diisocyanate. The product was similar except for the added presence of the reaction product of pentaerythritol triacrylate with the tolylene-2,6-diisocyanate isomer. The resulting plate was comparable to that of part C of Example 1.

Example 5

A. 456 Parts of dry benzene and 261 parts of tolylene-2,4-diisocyanate were charged into a dry three-necked flask. While cooling and maintaining the temperature at 25–30°C., there was added over a period of 15 minutes 195 parts of dry 2-ethyl hexanol containing 1 part of dibutyl tin acetate. The liquid reaction mass was stirred at room temperature for several hours and then allowed to stand overnight.

The reaction mass, an almost colorless non-viscous liquid, was freed from the benzene solvent under vacuum, first at 125 Torr. and up to 70°C. and then at 20 Torr. and 80°C. The vacuum was released with nitrogen, and the reaction mass discharged. The yield was 459 parts of liquid 4,N,2-isocyanato-toluyl-β-ethyl hexyl carbamate having the formula

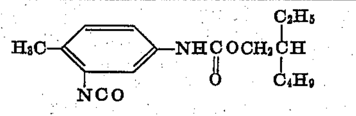

B. 607 Parts of pentaerythritol-3.46-acrylate, prepared by the process of part A of Example 1, and 0.5 part of dibutyl tin acetate were charged into a dry three-necked flask equipped with an agitator, a thermometer, a dropping funnel, and a gas inlet and outlet tube. While agitating at 45°C. and passing a small stream of dry air through the flask above the surface of the liquid, 98.8 parts of 4,N,2-isocyanato-toluyl-β-ethyl hexyl carbamate prepared as in part A was charged at once through the dropping funnel. The liquid reaction mass was stirred at 45°C. for several hours, allowed to stand overnight, and then discharged.

The reaction product was a viscous, slightly yellow liquid having a viscosity of 4560 Cps. as measured at 25°C. with a Brookfield Viscosimeter (No. 4 spindle at 60 rpm.). Infrared analysis of the product indicated the absence of the isocyanate absorption peak, and, therefore, complete reaction at 20-hours reaction time. The material was a physical mixture of unchanged pentaerythritol triacrylate, unreacted pentaerythritol tetraacrylate, and the reaction product of pentaerythritol triacrylate with 4,N,2-isocyanate-toluyl-β-ethyl hexyl carbamate, that is, the compound having the formula

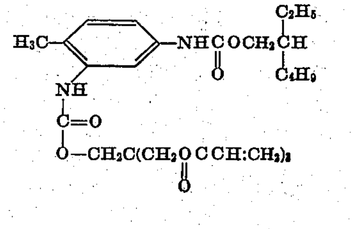

C. The product of part B was made into a printing plate as in part C of Example 1. The results were comparable.

Example 6

The procedures of parts B and C of Example 5 were repeated except that the carbamate was a 80/20 mixture of 4,N,2-isocyanato-toluyl-β-ethyl hexyl carbamate and 6,N,2-isocyanato-toluyl-β-ethyl hexyl carbamate. The results were comparable, except for the added presence of the reaction product of pentaerythritol triacrylate with the 6,N,2-isocyanato-toluyl-β-ethyl hexyl carbamate isomer.

Example 7

The procedure of Example 1 was repeated except that each of the following monomeric materials was used instead of pentaerythritol-3.46-acrylate: ethylene glycol dimethacrylate, triethylene glycol dimethacrylate, tetraethylene glycol diacrylate, tetraethylene glycol dimethacrylate, trimethylolpropane triacrylate, trimethylolethane triacrylate, trimethylolpropane trimethacrylate pentaerythritol trimethacrylate pentaerythritol diitaconate, a 50/50 mixture of pentaerythritol triacrylate and pentaerythritol tetraacrylate and a mixture of dimers and trimers of pentaerythritol triacrylate. The results were comparable.

Example 8

The procedure of Example 1 was repeated except that each of the following isocyanates was used instead of phenyl isocyanate: tolylene-2,4-diisocyanate, tolylene-2,6-diisocyanate, o-tolyl isocyanate, p-chlorophenyl isocyanate, cyclohexyl isocyanate, allyl isocyanate, n-butyl isocyanate, and methyl isocyanate. The results were comparable.

Example 9

The procedure of Example 1 (C) was repeated with each of the following initiators instead of Aroclor 4465: Aroclor 1240 (Monsanto Chemical Co.'s biphenyl containing 40 percent by weight of chlorine), Aroclor 5460 (Monsanto Chemical Co.'s triphenyl containing 60 percent by weight of chlorine), desyl bromide, didesyl ether, desyl amine, benzoin methyl ether, benzoin ethyl ether, triethyl amine, triethanol amine, Parlon S-5 (Hercules Powder Co.'s chlorinated rubber), Chlorowax 70 (Diamond Alkali Co.'s chlorinated aliphatic wax), and chlorendic anhydride. The results were comparable.

Example 10

The procedure of Example 1 (C) was repeated except that the element was exposed in each of the following ways instead of through a negative: (a) through a stencil and (b) by a projected design. The results were comparable.

Example 11

The procedure of Example 1 (C) was repeated except that the support was each of the following instead of aluminum: copper sheet, polyethylene board, tin plate, and Mylar polyester film (polyethylene terephthalate). The results were comparable.

Example 12

The procedures of Examples 1–11 were repeated except that instead of being exposed to ultraviolet light the plates were passed on a conveyor belt beneath the beam of a Dynacote 30,000-volt linear electron accelerator at a speed and beam current so regulated as to produce a dose rate of 0.5 megarad.

These systems produced resinous materials of varying degrees of hardness in films from 0.5 to 20 mils thick having tacky surfaces.

Example 13

The procedures of Examples 1–11 were repeated except that instead of being exposed to ultraviolet light the plates were exposed to a combination of ultraviolet light and electron beam radiation in a variety of arrangements: ultraviolet light, then electron beam; electron beam, then ultraviolet light; ultraviolet light before and after electron beam; electron beam before and after ultraviolet radiation; and simultaneous electron beam and ultraviolet light radiation. The results were comparable.

What is claimed is:

1. A presensitized printing plate comprising a support and a photopolymerizable composition thereon consisting of (a) about 15–99 parts of at least one product of the reaction of (1) a polyfunctional polyethylenically unsaturated monomeric ester having free hydroxyl groups and formed by the reaction of an ethylenically unsaturated acid and a polyhydric alcohol with (2) an organic isocyanate, the isocyanate-modified ester product *a* having free hydroxyl groups, and (b) about 1–85 parts of at least one photoinitiator.

2. The printing plate of claim 1 wherein the ester (1) is a di- or polyacrylate, a di- or polymethacrylate, or a di- or polyitaconate.

3. The printing plate of claim 1 wherein the ratio of ester *a* to photoinitiator *b* is about 30–70:30–70.

4. The printing plate of claim 1 wherein the photoinitiator *b* is an acyloin; an acyloin derivative; a halogenated aromatic, alicyclic, or aliphatic hydrocarbon; or a mixture thereof.

5. The printing plate of claim 4 wherein at least one of the halogen atoms is bonded directly to the nucleus in the aromatic and alicyclic hydrocarbons and to the carbon chain in the aliphatic hydrocarbon and the halogen is chlorine, bromine, iodine, or fluorine.

6. The printing plate of claim 1 wherein the polyethylenically unsaturated ester *a* is a pentaerythritol acrylate.

7. The printing plate of claim 6 wherein the pentaerythritol acrylate is a mixture of the triacrylate and the tetraacrylate.

8. The printing plate of claim 1 wherein the isocyanate is phenyl isocyanate.

9. The printing plate of claim 1 wherein the isocyanate is tolylene diisocyanate.

10. The printing plate of claim 1 wherein the support is aluminum.

11. The printing plate of claim 1 wherein the support is polyethylene terephthalate.

* * * * *